US009679798B2

(12) United States Patent
Iwashita et al.

(10) Patent No.: US 9,679,798 B2
(45) Date of Patent: Jun. 13, 2017

(54) SUBSTRATE CONVEYANCE APPARATUS AND SUBSTRATE PEELING SYSTEM

(71) Applicants: Tokyo Electron Limited, Tokyo (JP); Intel Corporation, Santa Clara, CA (US)

(72) Inventors: Yasuharu Iwashita, Kumamoto (JP); Osamu Hirakawa, Kumamoto (JP); Yasutaka Soma, Kumamoto (JP); Takeshi Tamura, Kumamoto (JP); Kazutaka Noda, Kumamoto (JP); Xavier Francois Brun, Chandler, AZ (US); Charles Wayne Singleton, Jr., Chandler, AZ (US)

(73) Assignees: Tokyo Electron Limited, Tokyo (JP); Intel Corporation, Santa Clara, CA (US)

( * ) Notice: Subject to any disclaimer, the term of this patent is extended or adjusted under 35 U.S.C. 154(b) by 301 days.

(21) Appl. No.: 14/182,969

(22) Filed: Feb. 18, 2014

(65) Prior Publication Data

US 2014/0234033 A1 Aug. 21, 2014

(30) Foreign Application Priority Data

Feb. 21, 2013 (JP) ................................ 2013-032521

(51) Int. Cl.

| | |
|---|---|
| ***B32B 38/10*** | (2006.01) |
| ***H01L 21/683*** | (2006.01) |
| *B32B 43/00* | (2006.01) |

(52) U.S. Cl.

CPC ........ *H01L 21/6838* (2013.01); *B32B 43/006* (2013.01); *Y10S 156/93* (2013.01); *Y10S 156/941* (2013.01)

(58) Field of Classification Search

CPC . H01L 21/6838; B32B 43/006; Y10S 156/93; Y10S 156/941

See application file for complete search history.

(56) References Cited

U.S. PATENT DOCUMENTS 5,067,762 A * 11/1991 Akashi ................ B25J 15/0616 271/97
7,360,322 B2 * 4/2008 Iwasaka ........... H01L 21/67784 294/188
8,057,602 B2 * 11/2011 Koelmel ........... H01L 21/67115 118/728

(Continued)

FOREIGN PATENT DOCUMENTS

JP 2000252248 A * 9/2000
JP 2007-176637 A 7/2007

(Continued)

*Primary Examiner* — Mark A Osele

(74) *Attorney, Agent, or Firm* — Abelman, Frayne & Schwab

(57) ABSTRACT

Disclosed is a substrate conveyance apparatus capable of suppressing a substrate from being damaged. The substrate conveyance apparatus includes a plurality of nozzles, and a main body unit. The plurality of nozzles are configured to jet a gas toward a surface of a substrate to hold the substrate in a non-contact manner. The main body unit is provided with the plurality of nozzles. At least surfaces of the plurality of nozzles are formed of a resin.

10 Claims, 14 Drawing Sheets

122 120 121 124 d2 122 62 62 d1 63 621 61 621 63 100 100 Z Y X 121

(56) References Cited

U.S. PATENT DOCUMENTS

| | | | | |
|---|---|---|---|---|
| 8,419,094 | B2 * | 4/2013 | Omiya | B25J 15/0616 269/21 |
| 9,187,256 | B2 * | 11/2015 | Iwasaka | H01L 21/6838 |
| 2010/0264679 | A1 * | 10/2010 | Moriya | H01L 21/6838 294/188 |
| 2011/0042983 | A1 * | 2/2011 | Yi | H01L 21/6838 294/65 |
| 2013/0327484 | A1 * | 12/2013 | Hirakawa | H01L 21/67092 156/711 |

FOREIGN PATENT DOCUMENTS

| | | | | |
|---|---|---|---|---|
| JP | 2007-254172 A | | 10/2007 | |
| JP | 2007-324442 A | | 12/2007 | |
| JP | 2008-533697 A | | 8/2008 | |
| JP | 2010-098178 A | | 4/2010 | |
| JP | 2012-501284 A | | 1/2012 | |
| JP | 2012-119591 A | | 6/2012 | |
| JP | 2013-026260 A | | 2/2013 | |
| WO | WO 2012140988 A1 | * | 10/2012 | H01L 21/67092 |

* cited by examiner

| FLEXURE OF SUBSTRATE TO BE PROCESSED | FLOW RATE OF GAS JETTING PART |
|---|---|
| large | large |
| medium | medium |
| small | small |

| FLEXURE OF SUBSTRATE TO BE PROCESSED | OPERATION TIMING OF GAS JETTING PART |
|---|---|
| large | early |
| medium | medium |
| small | late |

SUBSTRATE CONVEYANCE APPARATUS AND SUBSTRATE PEELING SYSTEM

CROSS-REFERENCE TO RELATED APPLICATIONS

This application is based on and claims priority from Japanese Patent Application No. 2013-032521, filed on Feb. 21, 2013, with the Japan Patent Office, the disclosure of which is incorporated herein in its entirety by reference.

TECHNICAL FIELD

The present disclosure relates to a substrate conveyance apparatus and a substrate peeling system.

BACKGROUND

A substrate conveyance apparatus configured to convey a substrate such as, for example, a silicon wafer or a compound semiconductor wafer while holding the substrate in a non-contact manner has been known in a related art.

For example, Japanese Patent Laid-Open Publication No. 2007-176637 discloses a substrate conveyance apparatus provided with a plurality of nozzles which jet a gas, in which the gas jetted from the respective nozzles generates a Bernoulli's effect between the nozzles and a substrate, thereby holding the substrate in a non-contact manner.

SUMMARY

The present disclosure provides a substrate conveyance apparatus including: a plurality of nozzles configured to jet a gas toward a surface of a substrate to hold the substrate in a non-contact manner, and a main body unit provided with the plurality of nozzles. At least the surfaces of the plurality of nozzles are formed of a resin The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
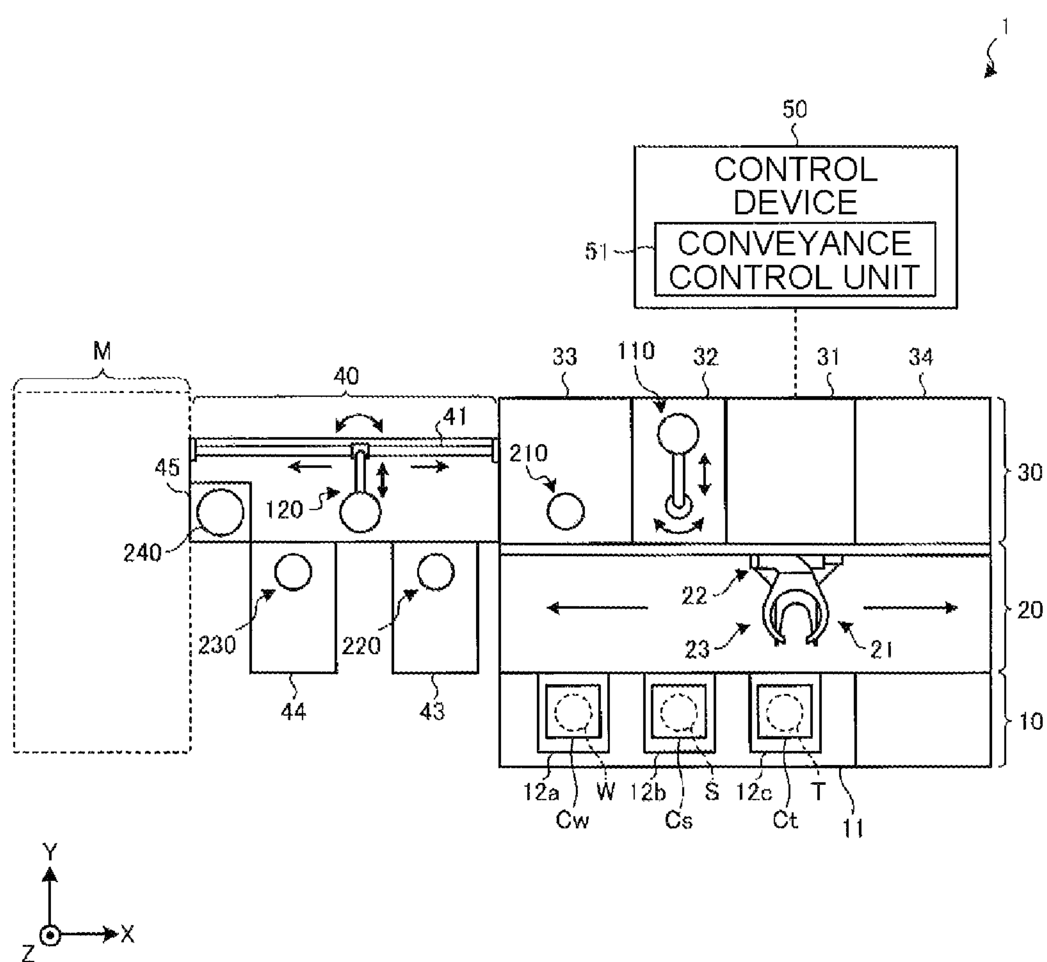
FIG. 1 is a schematic plan view illustrating a configuration of a substrate peeling system according to a first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The substrate conveyance apparatus configured to convey a substrate while holding the substrate in a non-contact manner is based on the premise that the substrate does not come in contact with the nozzles. However, for example, when the substrate is flexed, the substrate may come in contact with the nozzles, thereby damaging the substrate.

An object of the present disclosure is to provide a substrate conveyance apparatus and a substrate peeling system capable of suppressing a substrate from being damaged.

An aspect of the present disclosure is to provide a substrate conveyance apparatus including a plurality of nozzles and a main body unit. The plurality of nozzles are configured to jet a gas toward a surface of a substrate to hold a substrate in a non-contact manner, and the main body unit is provided with the plurality of nozzles, wherein at least surfaces of the plurality of nozzles are formed of a resin The resin has a thermal expansion coefficient which is substantially the same as that of the main body unit.

The main body unit is formed of aluminum, and the resin is a polybenzoimidazole (PBI) resin.

At least some of the plurality of nozzles have a chamfered distal end surface.

The plurality of nozzles include first nozzles arranged circumferentially on the main body unit, and second nozzles arranged circumferentially at a more inner circumferential side than the first nozzles on the main body unit, only the first nozzles having the chamfered distal end surface.

The plurality of nozzles are fixed to the main body unit by screws.

The plurality of nozzles have screw holes through which the screws are inserted, and distal end portions of the screw holes at which screw heads of the screws are disposed are formed more deeply as compared to the screw heads.

The apparatus further includes a gas jetting part provided at a more outer peripheral side of the main body unit than the plurality of nozzles, and configured to jet a gas toward an outer peripheral portion of the substrate.

The gas jetting part jets the gas at a flow rate smaller than a flow rate of the gas jetted from the plurality of nozzles.

Another aspect of the present disclosure is to provide a substrate peeling system including: a peeling apparatus configured to separate a superimposed substrate including a first substrate bonded to a second substrate into the first substrate and the second substrate; and a substrate conveyance apparatus configured to convey the first substrate separated by the peeling apparatus while holding the first substrate in a non-contact manner, wherein the substrate conveyance apparatus includes a plurality of nozzles configured to jet a gas toward a surface of the first substrate to hold the first substrate in a non-contact manner, and a main body unit provided with the plurality of nozzles, wherein at least surfaces of the plurality of nozzles are formed of a resin.

According to the present disclosure, the substrate may be suppressed from being damaged.

Hereinafter, exemplary embodiments of the substrate conveyance apparatus and the substrate peeling system according to the present disclosure will be described in detail with reference to accompanying drawings. In the exemplary embodiments to be described later, the substrate conveyance apparatus according to the present disclosure is employed in the substrate peeling system configured to perform the peeling of a superimposed substrate. However, the substrate conveyance apparatus according to the present disclosure may be employed in other systems besides the substrate peeling system.

First Exemplary Embodiment

First, the configuration of a substrate peeling system according to a first exemplary embodiment will be described with reference to FIGS. 1 and 2. FIG. 1 is a schematic plan view illustrating the configuration of the substrate peeling system according to the first exemplary embodiment, and FIG. 2 is a schematic side view of a superimposed substrate.

Hereinafter, in order to clarify the positional relationship, an X-axis direction, a Y-axis direction and a Z-axis direction which are perpendicular to each other are defined, and a Z-axis positive direction is determined as a vertically upward direction.

A substrate peeling system 1 according to the first exemplary embodiment, as illustrated in FIG. 1, separates a superimposed substrate T (see FIG. 2) including a substrate to be processed W and a support substrate S which are bonded through an adhesive G into the substrate to be processed W and the support substrate S.

Figure 2:
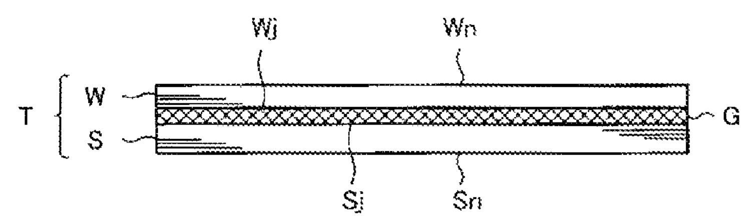
FIG. 2 is a schematic side view of a superimposed substrate.

Hereinafter, as illustrated in FIG. 2, of flat surfaces of the substrate to be processed W, a flat surface to be bonded to the support substrate S through the adhesive G will be referred to as "a bonded surface Wj", and a flat surface opposite to the bonded surface Wj will be referred to as "a non-bonded surface Wn". Of flat surfaces of the support substrate S, a flat surface to be bonded to the substrate to be processed W through the adhesive G will be referred to as "a bonded surface Sj", and a flat surface opposite to the bonded surface Sj will be referred to as "a non-bonded surface Sn".

The substrate to be processed W may be a semiconductor substrate such as for example, a silicon wafer or a compound semiconductor wafer that is formed with a plurality of electronic circuits, and the flat surface formed with the electronic circuits is set as the bonded surface Wj. The substrate to be processed W is thinned by, for example, polishing the non-bonded surface Wn. Specifically, the thickness of the substrate to be processed W ranges from about 20 μm to about 50 μm.

The support substrate S has the substantially same diameter as the substrate to be processed W and supports the substrate to be processed W. The thickness of the support substrate S ranges from about 650 μm to about 750 μm. As for the support substrate S, besides the silicon wafer, for example, a glass substrate may be used. The thickness of the adhesive G that bonds the substrate to be processed W to the support substrate S ranges from about 40 μm to about 150 μm.

The substrate peeling system 1, as illustrated in FIG. 1, includes a carrying-in/out station 10, a first conveyance region 20, a peeling station 30, a second conveyance region 40, and a control device 50. The carrying-in/out station 10 and the peeling station 30 are disposed in a row in the Y-axis direction with the first conveyance region 20 being interposed therebetween. The second conveyance region 40 is disposed at the X-axis negative direction side of the carrying-in/out station 10, the first conveyance region 20 and the peeling station 30.

In the substrate peeling system 1, the superimposed substrate T carried into the carrying-in/out station 10 is conveyed to the peeling station 30 through the first conveyance region 20, and is separated into the substrate to be processed W and the support substrate S in the peeling station 30. The separated substrate to be processed W is conveyed to a post processing station M through the second conveyance region 40, and the separated support substrate S is conveyed to the carrying-in/out station 10 through the first conveyance region 20. In the substrate peeling system 1, the substrate to be processed W which becomes defective may be conveyed to the carrying-in/out station 10 through the first conveyance region 20.

In the carrying-in/out station 10, a cassette Cw that accommodates a plurality of substrates to be processed W, a cassette Cs that accommodates a plurality of support substrates S, and a cassette Ct that accommodates a plurality of superimposed substrates T are carried to or from the outside of the substrate peeling system 1. In the carrying-in/out station 10, a cassette mounting unit 11 is provided, and a plurality of cassette mounting plates 12*a* to 12*c* on which the cassettes Cw, Cs and Ct are placed, respectively, are provided on the cassette mounting unit 11. In the cassette Cw, a substrate to be processed W which is conveyed as, for example, a defective product from the peeling station 30 is accommodated.

In the first conveyance region 20, conveyance of the support substrates S, the superimposed substrates T, and the substrates to be processed W between the carrying-in/out station 10 and the peeling station 30 is performed. The first conveyance region 20 is provided with a first conveyance apparatus 21 configured to convey the substrates to be processed W, the support substrates S and the superimposed substrates T.

The first conveyance apparatus 21 is a conveyance robot provided with a conveyance arm 22 and a fork 23 attached to the distal end of the conveyance arm 22. The conveyance arm 22 is configured to be capable of moving in the horizontal direction and in the vertical direction and rotating around the vertical axis. The first conveyance apparatus 21 holds a substrate by using the fork 23, and conveys the substrate held by the fork 23 to a required position by the conveyance arm 22.

In the peeling station 30, for example, the separation of the superimposed substrate T, and the cleaning of the substrate to be processed W and the support substrate S which are separated from the superimposed substrate T are performed. In the peeling station 30, a peeling apparatus 31, a delivery chamber 32, a first cleaning apparatus 33 and a second cleaning apparatus 34 are disposed in a row in the order of the first cleaning apparatus 33, the delivery chamber 32, the peeling apparatus 31, and the second cleaning apparatus 34 in the X axis positive direction.

The peeling apparatus 31 performs a peeling processing to separate the superimposed substrate T conveyed by the first conveyance apparatus 21 into the substrate to be processed W and the support substrate S. As for the peeling apparatus 31, for example, an apparatus disclosed in Japanese Patent Laid-Open Publication No. 2013-004845 or Japanese Patent Laid-Open Publication No. 2012-069914 may be used.

The delivery chamber 32 is provided with a second conveyance apparatus 110 configured to convey the substrate to be processed W which has been separated from the superimposed substrate T by the peeling apparatus 31 into the first cleaning apparatus 33.

The first cleaning apparatus 33 performs cleaning of the substrate to be processed W conveyed by the second conveyance apparatus 110. The first cleaning apparatus 33 is provided with a spin chuck 210 which rotates while holding the substrate to be processed W by suction. The first cleaning apparatus 33 rotates the substrate to be processed W by using the spin chuck 210 while ejecting a cleaning liquid to the substrate to be processed W to clean the substrate to be processed W.

The substrate to be processed W cleaned by the first cleaning apparatus 33 is conveyed to the post processing station M through the second conveyance region 40 and is subjected to a predetermined post processing in the post processing station M. The predetermined post processing may include, for example, a processing of mounting the substrate to be processed W, and a processing of dicing each chip of the substrate to be processed W.

The second cleaning apparatus 34 performs cleaning of the support substrate S which has been separated from the superimposed substrate T in the peeling apparatus 31. The support substrate S cleaned by the second cleaning apparatus 34 is conveyed to the carrying-in/out station 10 by the first conveyance apparatus 21.

The second conveyance region 40 is provided between the peeling station 30 and the post processing station M. A third conveyance apparatus 120 capable of moving on a conveyance path 41 which extends in the X-axis direction is provided in the second conveyance region 40. By the third conveyance apparatus 120, conveyance of the substrate to be processed W between the peeling station 30 and the post processing station M is performed.

In the second conveyance region 40, a third cleaning apparatus 43 and a fourth cleaning apparatus 44 are disposed in a row in the order of the third cleaning apparatus 43 and the fourth cleaning apparatus 44 in the X-axis negative direction. For example, the third cleaning apparatus 43 and the fourth cleaning apparatus 44 have the same configuration as that of the first cleaning apparatus 33, and are provided with spin chucks 220 and 230, respectively, which are the same as the spin chuck 210. The substrate to be processed W is cleaned by the third cleaning apparatus 43 and the fourth cleaning apparatus 44, and delivered to the post processing station M.

In the second conveyance region 40, a delivery unit 45 configured to deliver the substrate to be processed W between the substrate peeling system 1 and the post processing station M is disposed. The delivery unit 45 is provided with a porous chuck 240 configured to hold the substrate to be processed W by suction. The substrate to be processed W is cleaned by the third cleaning apparatus 43 and the fourth cleaning apparatus 44, and then placed on the porous chuck 240 by the third conveyance apparatus 120 to be held by the porous chuck 240 by suction.

The porous chuck 240, unlike the spin chucks 210, 220, and 230, does not have a rotation function, and has a larger diameter than the spin chuck 210 because the porous chuck 240 does not clean the substrate to be processed W.

The control device 50 is configured to control the operation of the substrate peeling system 1 and is provided with, for example, a conveyance control unit 51. The conveyance control unit 51 is a processing unit configured to control the conveyance of a substrate such as, for example, the superimposed substrate T or the substrate to be processed W by the second conveyance apparatus 110 and the third conveyance apparatus 120.

The control device 50 is, for example, a computer, and reads and executes a program recorded in a memory unit (not illustrated) to control the operation of the substrate peeling system 1. Such a program may be recorded in a computer-readable recording medium and then installed to the memory unit of the control device 50 from the recording medium. Examples of the computer-readable recording medium may include a hard disk (HD), a flexible disk (FD), a compact disk (CD), a magnetic optical disk (MO), and a memory card.

The separated substrate to be processed W is thin (20 μm to 50 μm), as described above, and thus, is likely to be damaged when conveyed. Accordingly, the substrate peeling system 1 uses a Bernoulli chuck as for each of the second conveyance apparatus 110 and the third conveyance apparatus 120 configured to convey the separated substrate to be processed W. The Bernoulli chuck is configured to convey the substrate to be processed W in a non-contact manner.

Here, it is assumed that the conventional Bernoulli chucks do not come in contact with a substrate. However, for example, when the substrate is flexed, the chuck may come in contact with the substrate, thereby damaging the substrate.

Therefore, in consideration of the above-described possibility that the second conveyance apparatus 110 and the third conveyance apparatus 120 may come in contact with the substrate, the second conveyance apparatus 110 and the third conveyance apparatus 120 according to the first exemplary embodiment are configured to hardly damage the substrate even by coming in contact with the substrate.

Figure 3:
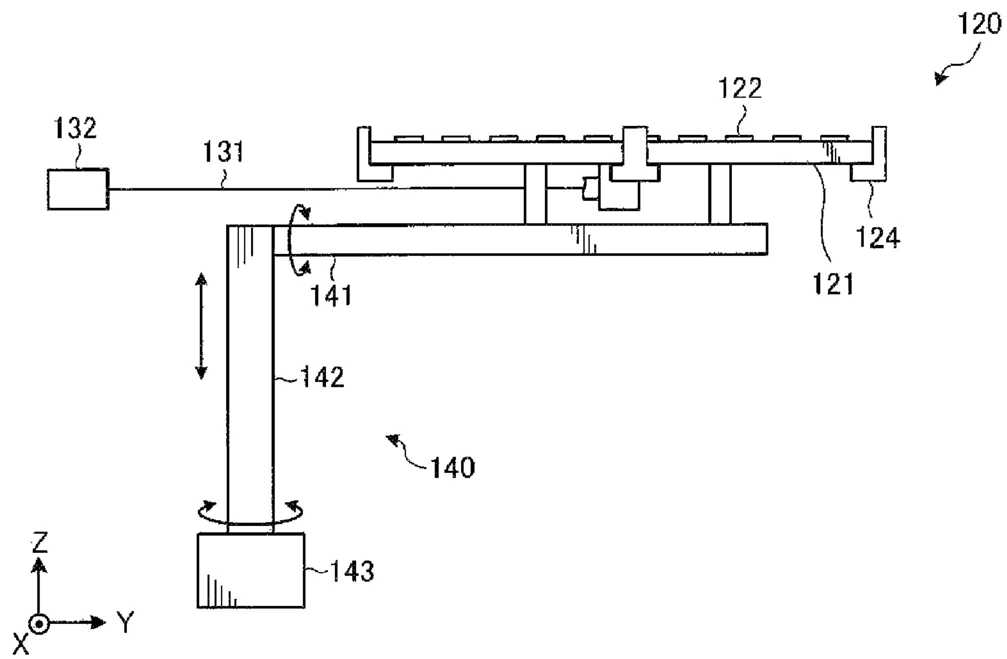
FIG. 3 is a schematic side view of a third conveyance apparatus according to the first exemplary embodiment.

Hereinafter, the above-described configurations of the second conveyance apparatus 110 and the third conveyance apparatus 120 will be described in detail. The second conveyance apparatus 110 and the third conveyance apparatus 120 have the same configuration, and thus, the configuration of the third conveyance apparatus 120 will be exemplified herein. FIG. 3 is a schematic side view of the third conveyance apparatus 120 according to the first exemplary embodiment, and FIG. 4 is a schematic perspective view of the same.

As illustrated in FIG. 3, the third conveyance apparatus 120 includes a main body unit 121, a plurality of nozzles 122, and a locking unit 124. The main body unit 121 is a disk-shaped member having the substantially same diameter as the substrate to be processed W (see FIG. 4). The main body unit 121 is formed of a metal such as, for example, aluminum.

The plurality of nozzles 122 are substantially cylindrical members each of which has a gas jetting hole in the central portion thereof. The nozzles 122 jet a gas toward the surface of the substrate to be processed W, thereby causing a Bernoulli's effect to hold the substrate to be processed W in a non-contact manner.

Figure 4:
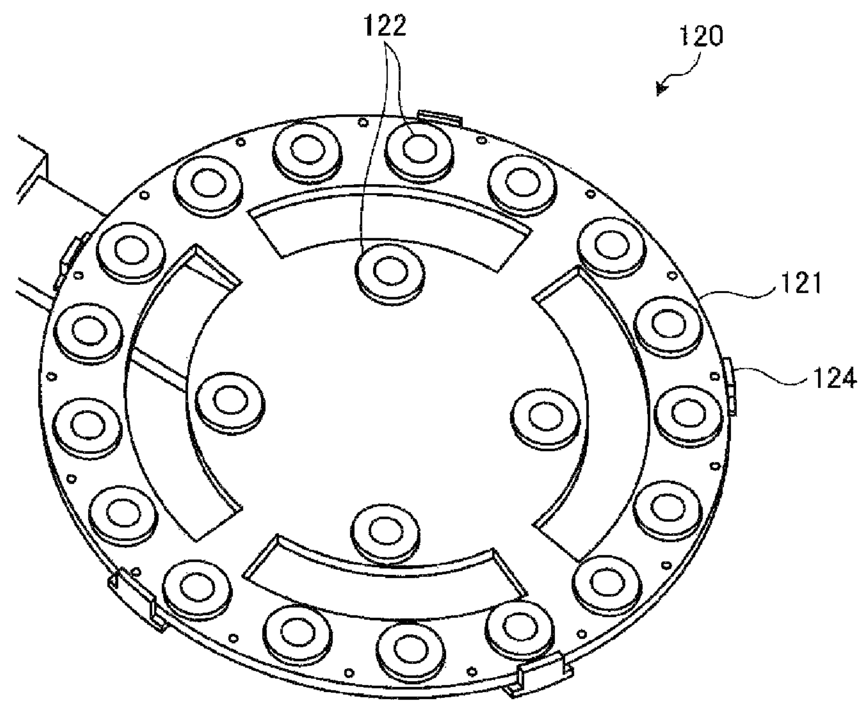
FIG. 4 is a schematic perspective view of the third conveyance apparatus according to the first exemplary embodiment.

The plurality of nozzles 122, as illustrated in FIG. 4, are arranged circumferentially with respect to the principal surface of the main body unit 121 and doubly at inner peripheral side and outer peripheral side.

Each of the nozzles 122 is connected to a gas supply device 132 via a gas supply tube 131, and jets a gas supplied from the gas supply device 132 through the gas supply tube 131. The gas jetted from each nozzle 122 is, for example, an inert gas e.g., nitrogen or a dry air.

The locking unit 124 is a member protruding in a direction perpendicular to the principal surface of the main body unit 121 and a plurality of locking units 124 are provided with predetermined intervals with respect to the outer periphery of the main body unit 121. The locking units 124 suppress the substrate to be processed W from falling off from the main body unit 121.

The number and the arrangement of the nozzles 122 and the locking units 124 provided in the main body unit 121 are not limited to those at illustrated in FIG. 4.

The third conveyance apparatus 120 is provided with a moving mechanism 140. The moving mechanism 140 is provided with a first arm 141, a second arm 142, and a base unit 143. The first arm 141 extends in a horizontal direction to support the main body unit 121 at the distal end portion thereof. The second arm 142 extends in the vertical direction to support the base end portion of the first arm 141 at the distal end portion thereof.

The base unit 143 is fixed to the conveyance path 41 (see FIG. 1) to support the second arm 142. A driving mechanism such as, for example, a motor, is provided in the base unit 143 to move up and down the second arm 142 in the vertical direction.

A base unit of a moving mechanism provided in the second conveyance apparatus 110 is fixed to, for example, the bottom surface of the delivery chamber 32.

The substrate to be processed W is thin, and thus is easily flexed. When the substrate to be processed W is flexed, especially in a convex shape with respect to the main body unit 121 of the third conveyance apparatus 120, the substrate to be processed W may come in contact with the nozzles 122. Conventional nozzles are formed of a metal and thus may damage the substrate to be processed W by coming in contact with the substrate to be processed W.

Therefore, in the third conveyance apparatus 120 according to the first exemplary embodiment, the nozzles 122 are formed of a resin. Accordingly, even if the substrate to be processed W comes in contact with the nozzles 122, the substrate to be processed W may be suppressed from being damaged.

As for such a resin, a resin having a thermal expansion coefficient which is substantially the same as that of the main body unit 121 is preferably used. By selecting such a resin, it is possible to suppress the nozzles 122 from being damaged by deformation caused between the main body unit 121 and the nozzles 122 due to a temperature change.

For example, when the main body unit 121 is formed of aluminum, a polybenzoimidazole (PBI) resin that has a thermal expansion coefficient which is substantially the same as that of the aluminum may be used as the resin for forming the nozzles 122. The thermal expansion coefficient of the PBI resin is about $23\times E^{-6}(1/K)$ while the thermal expansion coefficient of aluminum is about $23.1\times E^{-6}(1/K)$. The PBI resin is excellent in heat resistance and chemical resistance, and thus is preferable in this respect. The thermal expansion coefficient of the resin for forming the nozzles 122 is preferably within a range of ±30% of the thermal expansion coefficient of the main body unit 121.

As for the resin for forming the nozzles 122, it is effective to use a polyacetal (POM) resin, instead of the PBI resin.

Figure 5A:
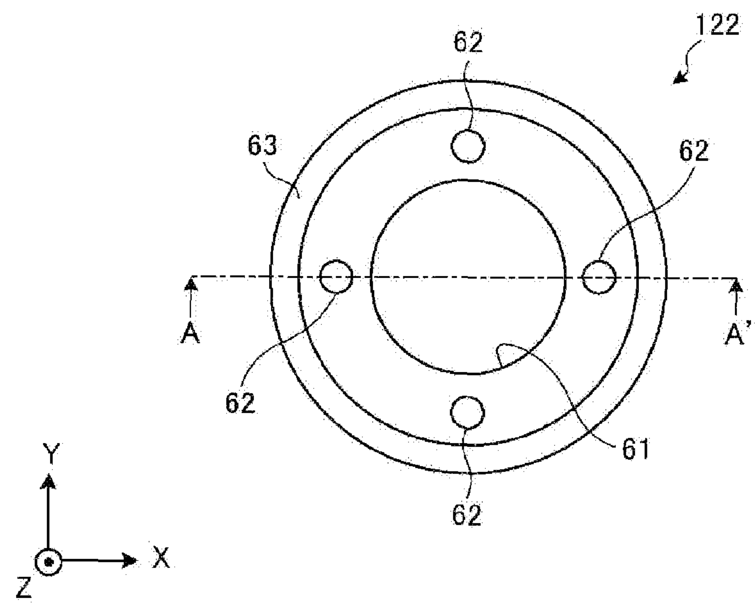
FIG. 5A is a schematic plan view of a nozzle.
Figure 5B:
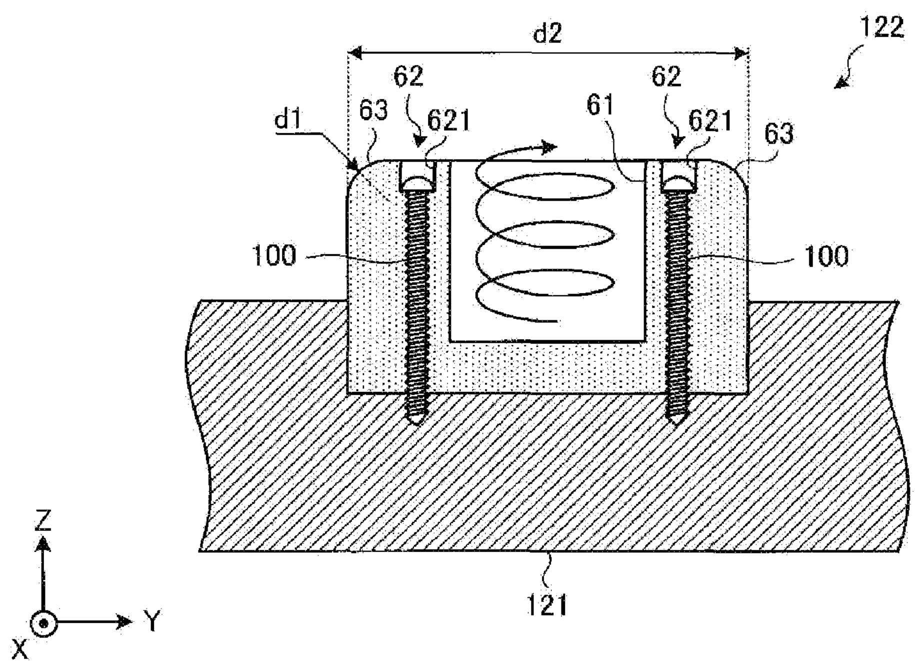
FIG. 5B is a schematic side sectional view of the nozzle.

Hereinafter, the shape of the nozzle 122 will be described with reference to FIGS. 5A and 5B. FIG. 5A is a schematic plan view of the nozzle 122, and FIG. 5B is a schematic side sectional view of the same. FIG. 5B corresponds to a cross-sectional view taken along A-A' line of FIG. 5A.

As illustrated in FIG. 5A, the nozzle 122 has a jetting hole 61 for a gas in the central portion thereof. The jetting hole 61 has a communication hole (not illustrated) in the inner circumferential surface, and the communication hole is connected to the gas supply tube 131 (see FIG. 3). The gas supplied from the gas supply device 132 is supplied into the jetting hole 61 via the gas supply tube 131 and the communication hole (not illustrated), and jetted from the jetting hole 61 with forming a swirling flow inside the jetting hole 61.

A plurality of screw holes 62 are formed in the nozzle 122. The plurality of screw holes 62 are formed to surround the periphery of the jetting hole 61. Screws 100 are inserted into the screw holes 62 to attach the nozzle 122 to the main body unit 121.

As described above, the third conveyance apparatus 120 according to the first exemplary embodiment has a configuration where the nozzle 122 is screwed to the main body unit 121 to improve easiness in replacement of the nozzle 122.

That is, since the nozzle 122 according to the first exemplary embodiment is formed of a resin, even when the nozzle 122 comes in contact with the substrate to be processed W, the substrate to be processed W may be suppressed from being damaged. However, the nozzle 122 may be more likely to be subjected to deterioration such as, for example, wear as compared to a metallic nozzle. For this reason, in order to easily replace the nozzle 122 upon being deteriorated, the nozzle 122 is configured to be screwed to the main body unit 121. This may improve maintainability.

A distal end portion 621 of each screw hole 62 at which a screw head of a screw 100 is disposed is formed more deeply as compared to the screw head. Accordingly, the screw head is not exposed from the screw hole 62. Thus, there is no possibility that the screw head comes in contact with the substrate to be processed W to damage the substrate to be processed W. In the example illustrated in FIG. 5A, the four screw holes 62 are formed in the nozzle 122, but the number of the screw holes 62 formed in the nozzle 122 is not limited to four.

The nozzle 122 has a chamfered distal end surface which faces the substrate to be processed W. This is because when the substrate to be processed W has a convex shape with respect to the main body unit 121, the substrate to be processed W is most likely to come in contact with the peripheral portion of the distal end surface of the nozzle 122. As described above, the nozzle 122 may have the distal end surface in a chamfered shape, thereby making it difficult for the substrate to be processed W to come in contact with the nozzle 122. Further, even if the substrate to be processed W comes in contact with the nozzle 122, the substrate to be processed W is hardly damaged because the distal end surface of the nozzle 122 is chamfered.

The larger a chamfered portion 63, the smaller the area of the distal end surface (flat surface) of the nozzle 122. This reduces a Bernoulli's effect, that is, the holding force of the substrate to be processed W. For this reason, the radius d1 of the chamfered portion 63 is preferably set to be, for example, less than 10% of the diameter d2 of the nozzle 122.

Figure 6A:
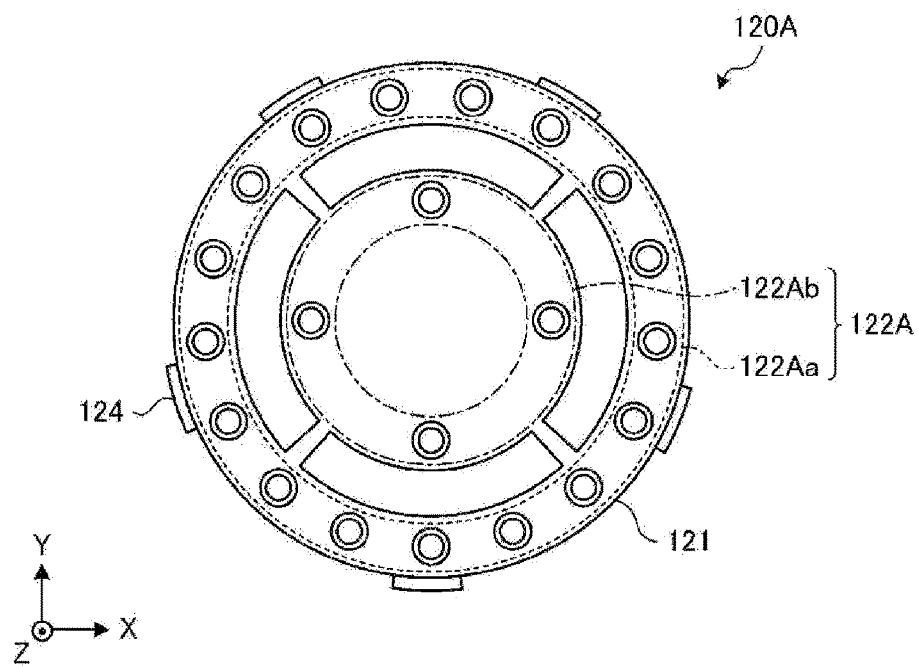
FIG. 6A is a schematic plan view of a third conveyance apparatus according to a first modified example of the first exemplary embodiment.
Figure 6B:
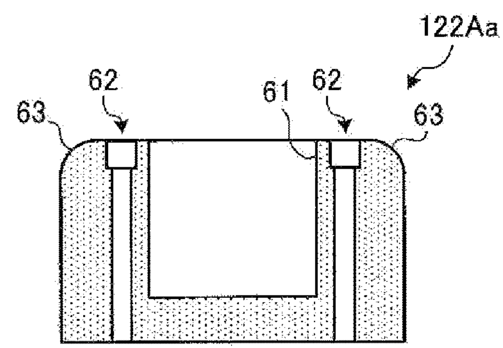
FIG. 6B is a schematic side sectional view of a first nozzle.
Figure 6C:
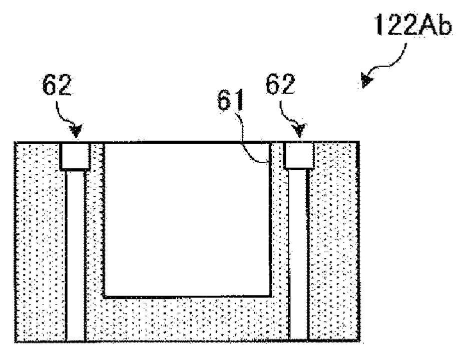
FIG. 6C is a schematic side sectional view of a second nozzle.

Hereinafter, modified examples of the third conveyance apparatus 120 will be described. First, a first modified example will be described with reference to FIGS. 6A to 6C. FIG. 6A is a schematic plan view of a third conveyance apparatus according to the first modified example of the first exemplary embodiment. FIG. 6B is a schematic side sectional view of a first nozzle, and FIG. 6C is a schematic side sectional view of a second nozzle.

As illustrated in FIG. 6A, a third conveyance apparatus 120A according to the first modified example is provided with nozzles 122A including first nozzles 122Aa arranged circumferentially along the peripheral portion of the main body unit 121, and second nozzles 122Ab arranged circumferentially at more inner circumferential side than the first nozzles 122Aa.

Each first nozzle 122Aa has the same shape as the above-described nozzles 122, and has a chamfered portion 63 at the distal end surface thereof as illustrated in FIG. 6B. Each second nozzle 122Ab, as illustrated in FIG. 6C, has a distal end surface which is not chamfered, unlike the above-described nozzles 122 or the first nozzles 122Aa.

When a substrate to be processed W has a convex shape with respect to the main body unit 121, the substrate to be processed W is most likely to come in contact with the peripheral portion of the distal end surfaces of the first nozzles 122Aa arranged along the outer peripheral portion. Therefore, in the third conveyance apparatus 120A according to the first modified example, only the first nozzles 122Aa which are likely to come in contact with the substrate to be processed W are formed with the chamfered portions 63, and the second nozzles 122Ab which are not likely to come in contact with the substrate to be processed W are not formed with the chamfered portions. This may make it difficult for the substrate to be processed W to come in contact with the first nozzles 122Aa while suppressing the reduction of a holding force.

Figure 7A:
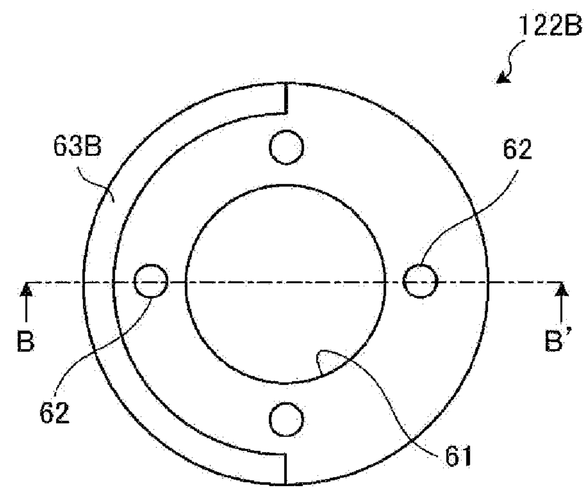
FIG. 7A is a schematic plan view of a nozzle according to a second modified example of the first exemplary embodiment.
Figure 7B:
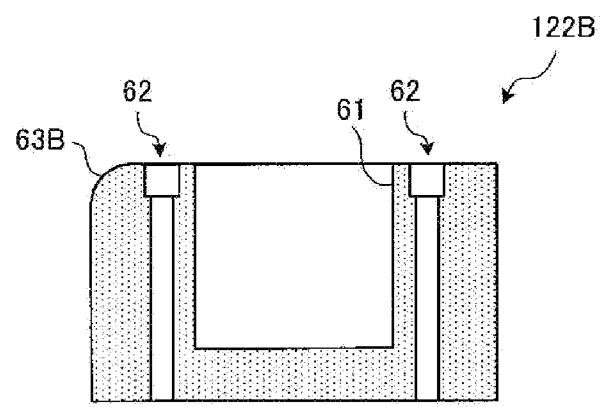
FIG. 7B is a schematic side sectional view of the nozzle according to the second modified example of the first exemplary embodiment.

Subsequently, a second modified example will be described with reference to FIGS. 7A and 7B. FIG. 7A is a schematic plan view of a nozzle according to the second modified example of the first exemplary embodiment. FIG. 7B is a schematic side sectional view of the nozzle according to the second modified example of the first exemplary embodiment. FIG. 7B corresponds to a cross-sectional view taken along B-B' line of FIG. 7A.

As illustrated in FIGS. 7A and 7B, a nozzle 122B according to the second modified example has a distal end surface which is partially chamfered. The nozzle 122B is provided in the main body unit 121 in a state where a chamfered portion 63B faces the outer peripheral side of the main body unit 121.

In this manner, the chamfered portion 63B is provided at only a portion facing the outer peripheral side of the main body unit 121, thereby further suppressing the holding force from being reduced.

In the main body unit 121, the nozzles 122B may be arranged circumferentially and doubly. Alternatively, the nozzles 122B may be arranged circumferentially along the peripheral portion of the main body unit 121, and the second nozzles 122Ab (see FIG. 6C) may be arranged circumferentially at the more inner circumferential side than the nozzles 122B.

Figure 8:
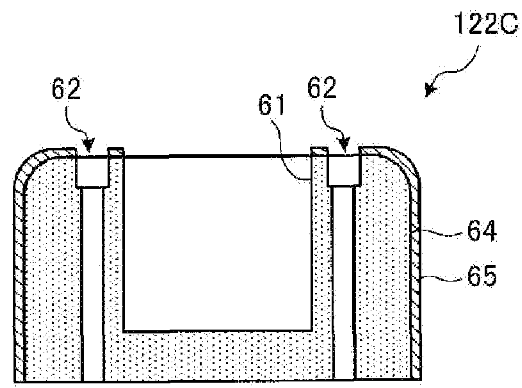
FIG. 8 is a schematic side sectional view of a nozzle according to a third modified example of the first exemplary embodiment.

Subsequently, a third modified example will be described with reference to FIG. 8. FIG. 8 is a schematic side sectional view of a nozzle according to the third modified example of the first exemplary embodiment.

In the above-described examples, all of the nozzles 122, 122A, and 122B are formed of a resin. However, only at least the surfaces of the nozzles may be formed of a resin.

For example, like a nozzle 122C illustrated in FIG. 8, the surface of a nozzle main body 65 formed of a metal may be coated with a resin 64.

As described above, the substrate peeling system 1 according to the first exemplary embodiment is provided with the peeling apparatus 31 and the third conveyance apparatus 120 or 120A. The peeling apparatus 31 separates a superimposed substrate T including a substrate to be processed W (first substrate) bonded to a support substrate S (second substrate) into the substrate to be processed W and the support substrate S. The third conveyance apparatus 120 or 120A conveys the substrate to be processed W separated by the peeling apparatus 31 while holding the substrate to be processed W in a non-contact manner.

The third conveyance apparatus 120 or 120A is provided with a plurality of nozzles 122, 122A, 122B, or 122C and a main body unit 121. The plurality of nozzles 122, 122A, 122B, or 122C jet a gas toward the surface of the substrate to be processed W, thereby holding the substrate to be processed W in a non-contact manner. The main body unit 121 is provided with the plurality of nozzles 122, 122A, 122B or 122C. At least the surface of each of the plurality of nozzles 122, 122A, 122B, or 122C is formed of a resin.

Therefore, in the substrate peeling system 1 according to the first exemplary embodiment, even when the substrate to be processed W comes in contact with the nozzles 122, 122A, 122B, or 122C, the substrate to be processed W may be suppressed from being damaged by the nozzles 122, 122A, 122B, or 122C.

Second Exemplary Embodiment

Figure 9:
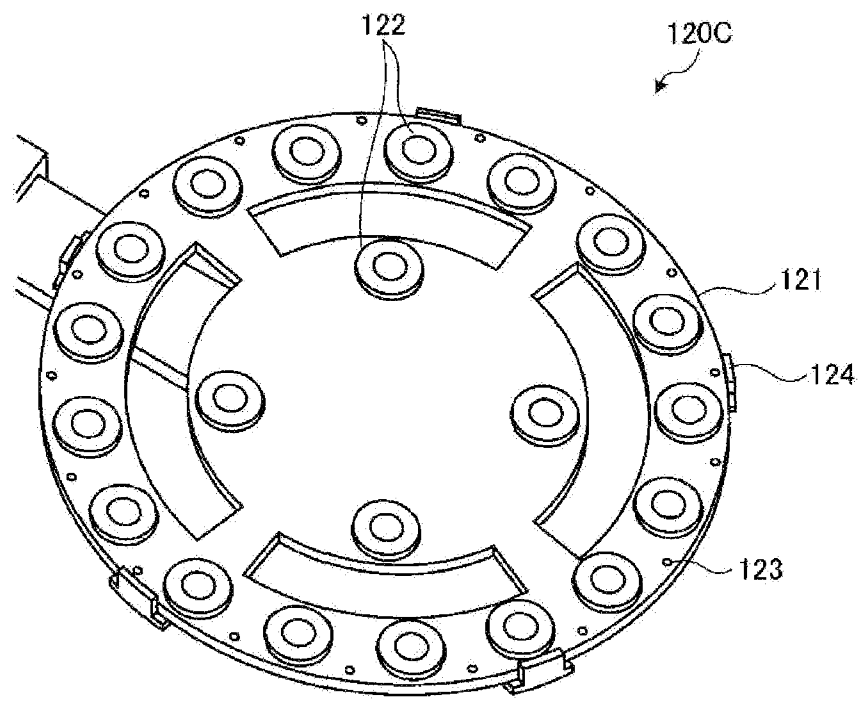
FIG. 9 is a schematic perspective view of a third conveyance apparatus according to a second exemplary embodiment.

Hereinafter, a third conveyance apparatus according to a second exemplary embodiment will be described. FIG. 9 is a schematic perspective view of the third conveyance apparatus according to the second exemplary embodiment. In the following description, the same components as those already described are denoted by the same reference numerals, and overlapping descriptions will be omitted.

As illustrated in FIG. 9, a third conveyance apparatus 120C according to the second exemplary embodiment further includes gas jetting parts 123 besides the respective components provided in the third conveyance apparatus 120 according to the first exemplary embodiment.

The gas jetting parts 123 are arranged to be concentric to nozzles 122 at the more outer peripheral side than the nozzles 122 arranged along the outer peripheral portion. The gas jetting parts 123 are members configured to jet a gas to the peripheral portion of a substrate to be processed W. Each of the gas jetting parts 123 is connected to a gas supply device (not illustrated) through a gas supply tube (not illustrated).

As illustrated in FIG. 9, each of the gas jetting parts 123 is provided at the substantially midpoint between each two adjacent nozzles 122 arranged along the outer peripheral portion. Accordingly, it is possible to suppress the gas jetted from the nozzles 122 and the gas jetted from the gas jetting parts 123 from interfering with each other.

Figure 10A:
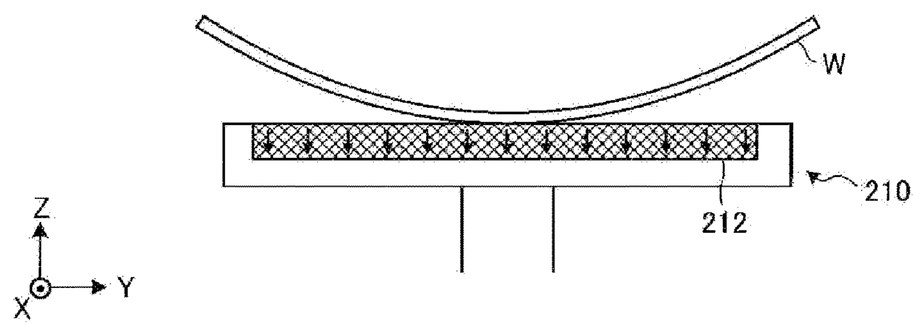
FIG. 10A is an explanatory view of a holding operation by the third conveyance apparatus according to the second exemplary embodiment.
Figure 10B:
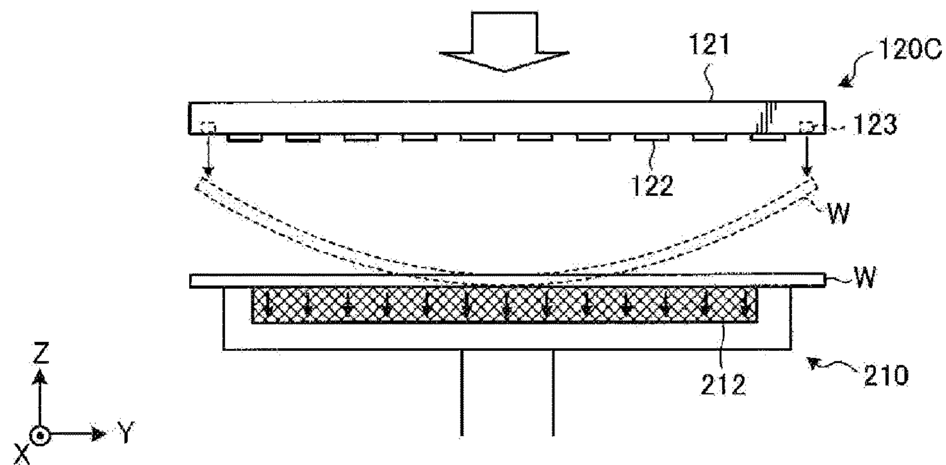
FIG. 10B is an explanatory view of the holding operation by the third conveyance apparatus according to the second exemplary embodiment.
Figure 10C:
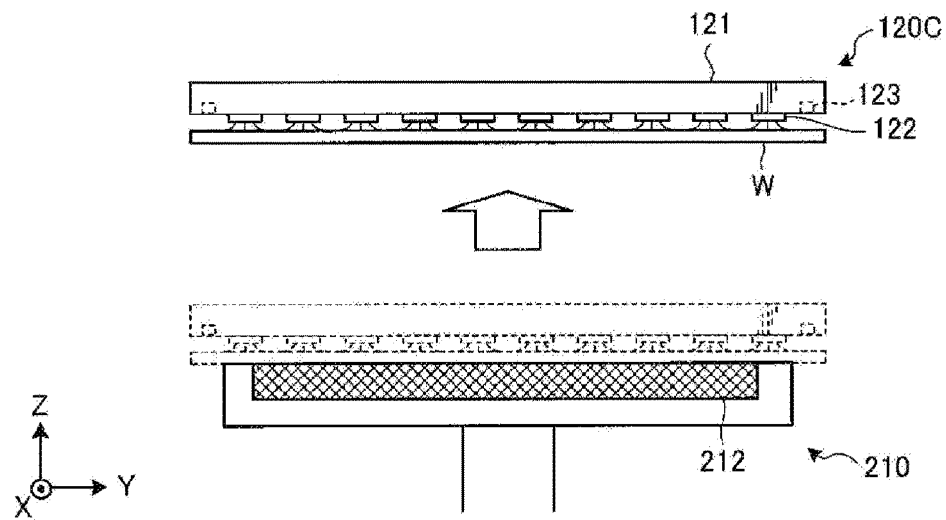
FIG. 10C is an explanatory view of the holding operation by the third conveyance apparatus according to the second exemplary embodiment.

The third conveyance apparatus 120C according to the second exemplary embodiment corrects flexure of a substrate to be processed W by using the gas jetted from the gas jetting parts 123. Hereinafter, descriptions will be made on the holding operation of a substrate to be processed W by the third conveyance apparatus 120C according to the second exemplary embodiment with reference to FIGS. 10A to 10C. FIG. 10A to 10C are explanatory views of a holding operation by the third conveyance apparatus 120 according to the second exemplary embodiment.

The holding operation by the third conveyance apparatus 120C is controlled by the conveyance control unit 51 provided in the control device 50. In FIGS. 10A to 10C, an example of a case where the third conveyance apparatus 120C receives a substrate to be processed W from the spin chuck 210 of the first cleaning apparatus 33 will be described.

As illustrated in FIG. 10A, it is assumed that the substrate to be processed W is flexed in a concave shape on the spin chuck 210. That is, it is assumed that the outer peripheral portion of the substrate to be processed W is flexed in a direction away from a suction-holding portion 212 of the spin chuck 210.

The third conveyance apparatus 120C, as illustrated in FIG. 10B, jets a gas from the gas jetting parts 123 in the Z-axis negative direction (vertically downward) while moving down toward the substrate to be processed W on the spin chuck 210.

The main body unit 121 has the substantially same diameter as the substrate to be processed W, and the gas jetting parts 123 are provided in the vicinity of the outer peripheral portion of the main body unit 121. Thus, the gas jetted from the gas jetting parts 123 touches the outer peripheral portion of the substrate to be processed W. As a result, the outer peripheral portion of the substrate to be processed W is pushed down vertically downward to correct the flexure of the substrate to be processed W. By correcting the flexure by the gas jetting parts 123, the substrate to be processed W is held on the entire surface of the suction-holding portion 212 of the spin chuck 210 by suction.

In this manner, the third conveyance apparatus 120C moves down to a position where the nozzles 122 perform holding of the substrate to be processed W (hereinafter, referred to as a "delivery position") while correcting the flexure of the substrate to be processed W by the gas jetting parts 123.

When reaching the delivery position of the substrate to be processed W, the third conveyance apparatus 120C jets a gas from the nozzles 122 to hold the substrate to be processed W in a non-contact manner. Accordingly, the substrate to be processed W is delivered from the spin chuck 210 to the third conveyance apparatus 120C (see FIG. 10C). The suction-holding by the spin chuck 210 is released when the third conveyance apparatus 120C holds the substrate to be processed W.

In this manner, the third conveyance apparatus 120C according to the second exemplary embodiment performs holding of the substrate to be processed W by using the nozzles 122 while correcting the flexure of the substrate to be processed W by using the gas jetting parts 123. This makes it further difficult for the substrate to be processed W to come in contact with the nozzles 122. In the third conveyance apparatus 120C according to the second exemplary embodiment, the flexure of the substrate to be processed W may be corrected. Thus, it is possible to properly perform delivery and holding of the substrate to be processed W which is flexed.

When the substrate to be processed W is flexed in a convex shape, that is, the substrate to be processed W is flexed in the reverse direction to that of FIG. 10A, the top surface of the spin chuck 210 is covered with the substrate to be processed W to be placed in a substantially sealed state. As a result, the substrate to be processed W is sucked by the spin chuck 210 to correct the flexure. In this manner, when the substrate to be processed W is flexed in a convex shape, it is possible to relatively easily perform holding or delivery of the substrate to be processed W even without using the gas jetting parts 123 of the third conveyance apparatus 120C.

Figure 11:
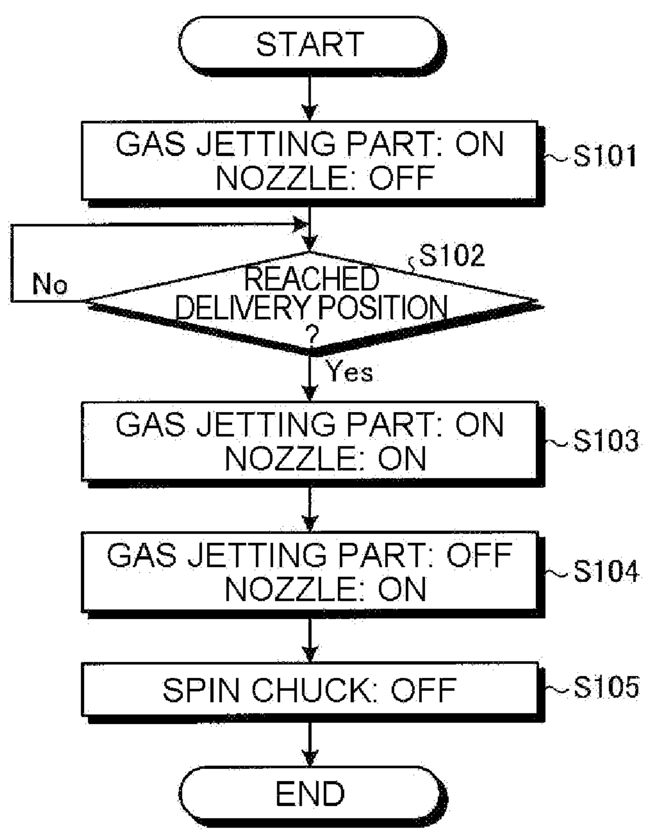
FIG. 11 is a flow chart illustrating a processing sequence of a flow rate control process according to the second exemplary embodiment.

Hereinafter, the processing sequence of the flow rate control process performed by the conveyance control unit 51 will be described with reference to FIG. 11. FIG. 11 is a flow chart illustrating a processing sequence of the flow rate control process. FIG. 11 also illustrates the processing sequence until a substrate to be processed W is held by the third conveyance apparatus 120C after jetting of a gas from the gas jetting parts 123 is started.

As illustrated in FIG. 11, the conveyance control unit 51, first, causes a gas to be jetted from the gas jetting parts 123 (step S101). For example, the conveyance control unit 51 executes the processing in step S101 when the third conveyance apparatus 120C has started to move down toward the spin chuck 210. Here, the jetting of the gas from the nozzles 122 is not performed yet.

Subsequently, the conveyance control unit 51 determines whether the nozzles 122 of the third conveyance apparatus 120C have reached the delivery position (step S102). When it is determined that the nozzles 122 have reached the delivery position (step S102, Yes), the conveyance control unit 51 starts gas jetting from the nozzles 122 (step S103), and then stops gas jetting from the gas jetting parts 123 (step S104).

Since the substrate to be processed W is thin, a force for correcting the flexure of the substrate to be processed W may be relatively small. For this reason, the flow rate of the gas jetted from the gas jetting parts 123 is set to be smaller than the flow rate of the gas jetted from the nozzles 122.

Subsequently, after the nozzles 122 hold the substrate to be processed W, the conveyance control unit 51 turns off the spin chuck 210 (step S105), and finishes the flow rate control process. When in step S102, the nozzles 122 of the third conveyance apparatus 120C have not reached the delivery position (step S102, No), the conveyance control unit 51 repeats the determination processing in step S102 until the third conveyance apparatus 120C reaches the delivery position.

In this manner, the third conveyance apparatus 120C according to the second exemplary embodiment further includes the gas jetting parts 123 which are provided at the more outer peripheral portion side of a substrate to be processed W than the nozzles 122 to jet a gas to the outer peripheral portion of the substrate to be processed W. Accordingly, the third conveyance apparatus 120C according to the second exemplary embodiment may make it further difficult for the substrate to be processed W to come in contact with the nozzles 122. Further, it is possible to easily perform delivery and holding of the substrate to be processed W which is flexed.

In the above description, gas jetting from the gas jetting parts 123 is stopped after gas jetting from the nozzles 122 is started. However, the gas jetting from the gas jetting parts 123 may be continued even after the substrate to be processed W is held by the nozzles 122. Accordingly, even during the conveyance of the substrate to be processed W by the third conveyance apparatus 120C, the flexure of the substrate to be processed W may be continuously corrected by the gas jetting parts 123. Thus, for example, it is possible to more securely suppress the substrate to be processed W from coming in contact with the third conveyance apparatus 120C.

Figures 12A, 12B, 12C:
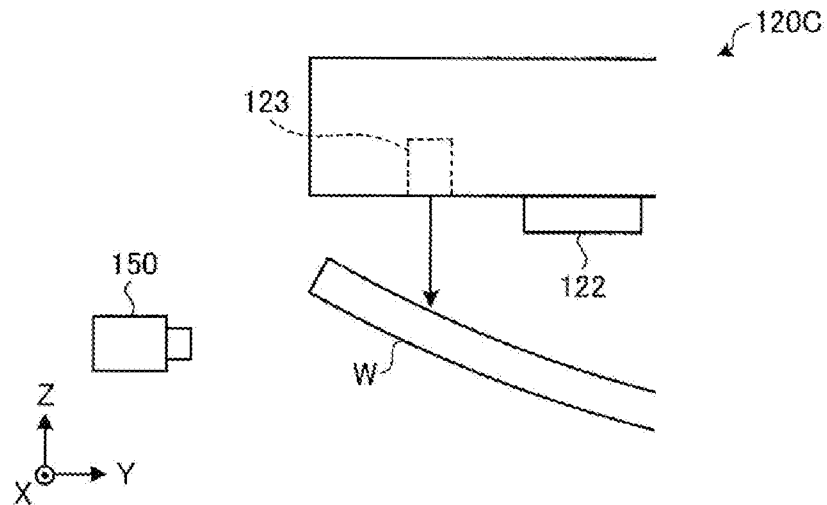
FIG. 12A is a view illustrating another configuration of the substrate peeling system.
FIG. 12B is a table illustrating the relationship between the flexure of a substrate to be processed and the flow rate of a gas jetted from gas jetting parts.
FIG. 12C is a table illustrating the relationship between the flexure of a substrate to be processed and the operation timing of gas jetting parts.

Meanwhile, the third conveyance apparatus 120C may be configured to vary the flow rate of the gas jetted from the gas jetting parts 123 according to the degree of flexure of the substrate to be processed W. A modified example of this case will be described with reference to FIGS. 12A and 12B. FIG. 12A is a view illustrating a modified example of the second exemplary embodiment. FIG. 12B is a table illustrating the relationship between the flexure of a substrate to be processed W and the flow rate of a gas jetted from the gas jetting parts 123.

As illustrated in FIG. 12A, for example, the first cleaning apparatus 33 may be further provided with an imaging device 150 such as, for example, a charge coupled device (CCD) camera. The imaging device 150 photographs a substrate to be processed W which is held by the spin chuck 210 by suction. The image data of the substrate to be processed W photographed by the imaging device 150 are input to the conveyance control unit 51 via a communication line (not illustrated). As for the imaging device 150, a water-proof device may be preferably used.

The conveyance control unit 51 determines the degree of flexure of the substrate to be processed W based on the image data of the substrate to be processed W which are obtained from the imaging device 150, and changes the flow rate of the gas jetted from the gas jetting parts 123 according to the determination result. Specifically, the conveyance control unit 51 increases the flow rate of the gas jetting parts 123 as the flexure degree of the substrate to be processed W is increased.

For example, as illustrated in FIG. 12B, the conveyance control unit 51 determines the flexure degree of the substrate to be processed W as three steps of "large", "medium" and "small". When determining the flexure degree of the substrate to be processed W as "large", the conveyance control unit 51 sets the flow rate of the gas jetting parts 123 as "large", and when determining the flexure degree of the substrate to be processed W as "medium", the conveyance control unit 51 sets the flow rate of the gas jetting parts 123 as "medium" which is smaller than "large". When determining the flexure degree of the substrate to be processed W as "small", the conveyance control unit 51 sets the flow rate of the gas jetting parts 123 as "small" which is smaller than "medium".

In this manner, the third conveyance apparatus 120C may increase the flow rate of the gas jetting parts 123 according to the increase of the flexure of the substrate to be processed W, so as to correct the flexure of the substrate to be processed W using a more appropriate flow rate.

The third conveyance apparatus 120C may vary the operation timing of the gas jetting parts 123, that is, the time when the gas is jetted from the gas jetting parts 123, as well as the flow rate of the gas jetting parts 123, according to the flexure degree of the substrate to be processed W. This will be described with reference to FIG. 12C. FIG. 12C is a table illustrating the relationship between the flexure of a substrate to be processed W and the operation timing of the gas jetting parts 123.

As illustrated in FIG. 12C, the conveyance control unit 51 allows the gas jetting parts 123 to be operated at an earlier time as the flexure degree of the substrate to be processed W is increased. Specifically, when determining the flexure degree of the substrate to be processed W as "large", the conveyance control unit 51 sets the operation timing of the gas jetting parts 123 as "early", and when determining the flexure degree of the substrate to be processed W as "medium", the conveyance control unit 51 sets the operation timing of the gas jetting parts 123 as "medium" which is later than "early". When determining the flexure degree of the substrate to be processed W as "small", the conveyance control unit 51 sets the operation timing of the gas jetting parts 123 as "late" which is later than "medium".

As the flexure of the substrate to be processed W is increased, the outer peripheral portion of the substrate to be processed W is positioned at a higher position, and thus, the substrate to be processed W and the third conveyance apparatus 120C may interfere with each other at an earlier time. For this reason, in the third conveyance apparatus 120C, the gas jetting parts 123 is operated at an earlier time when the flexure of the substrate to be processed W is increased so as to securely suppress the third conveyance apparatus 120C from coming in contact with the substrate to be processed W.

In the above-described example, it is assumed that the direction of the gas jetted from the gas jetting parts 123 is vertically downward. However, the direction of the gas jetted from the gas jetting parts 123 is not limited to the vertically downward direction. For example, the gas jetting parts 123 may be attached at a predetermined angle based on the flexure of the substrate to be processed W. Accordingly, the flexure of the substrate to be processed W may be corrected effectively at a smaller flow rate as compared to the case where the gas is jetted vertically downward.

The angle of the gas jetting parts 123 may be varied by a driving unit such as, for example, a motor, such that the angle of the gas jetted from the gas jetting parts 123 may be adjusted according to the flexure degree of the substrate to be processed W. In such a case, the conveyance control unit 51 determines the flexure degree of the substrate to be processed W based on the image data of the substrate to be processed W which are obtained from the imaging device 150 (see FIG. 12A), and changes the angle of the gas jetted by the gas jetting parts 123 according to the determination result. Specifically, the conveyance control unit 51 increases the jetting angle as the flexure degree of the substrate to be processed W is increased. It is assumed that the jetting angle is increased when the gas jetting parts 123 are more oriented toward the outer peripheral side of the main body unit 121, and the jetting angle is reduced when the gas jetting parts 123 are more oriented toward the central portion.

In this manner, when the flexure of the substrate to be processed W is increased, the angle of the gas jetted from the gas jetting parts 123 may be set to be larger toward the outer peripheral portion of the substrate to be processed W. This may allow the gas jetted from the gas jetting parts 123 to more effectively come in contact with the outer peripheral portion of the substrate to be processed W.

The gas jetting parts 123 may include first jetting parts attached vertically downward, and second jetting parts which are attached at a predetermined angle based on the flexure of the substrate to be processed W. The first jetting parts and the second jetting parts are connected to different gas supply devices via different gas supply tubes, respectively.

The conveyance control unit 51 may determine the flexure degree of the substrate to be processed W based on the image data of the substrate to be processed W which are obtained from the imaging device 150, and switch gas jetting parts to be used between the first jetting parts and the second jetting parts according to the determination result.

For example, when determining the flexure degree of the substrate to be processed W as "small", the conveyance control unit 51 switches the gas jetting parts to be used to the first jetting parts, and when determining the flexure degree of the substrate to be processed W as "large", the conveyance control unit 51 switches the gas jetting parts to be used to the second jetting parts. In this manner, the gas may be jetted at a jetting angle according to the flexure of the substrate to be processed W without providing a mechanism for changing the jetting angle of the gas in the main body unit.

The method of determining the flexure degree of a substrate to be processed W is not limited to the method of using the image data photographed by the imaging device 150. For example, a distance to the substrate to be processed W may be measured by using a distance measuring sensor or an ultrasonic sensor, and according to the distance, the flexure degree of the substrate to be processed W may be determined

Third Exemplary Embodiment

In the above-described second exemplary embodiment, for example, the third conveyance apparatus 120C is provided with the gas jetting parts 123 and the flexure of a substrate to be processed W is corrected by using the gas jetting parts 123. However, the method of correcting the flexure of the substrate to be processed W is not limited to the above-described example. For example, the flexure of the substrate to be processed W may be corrected by using nozzles 122. Hereinafter, an example of correcting the flexure of the substrate to be processed W by using the nozzles 122 will be described.

Figure 13:
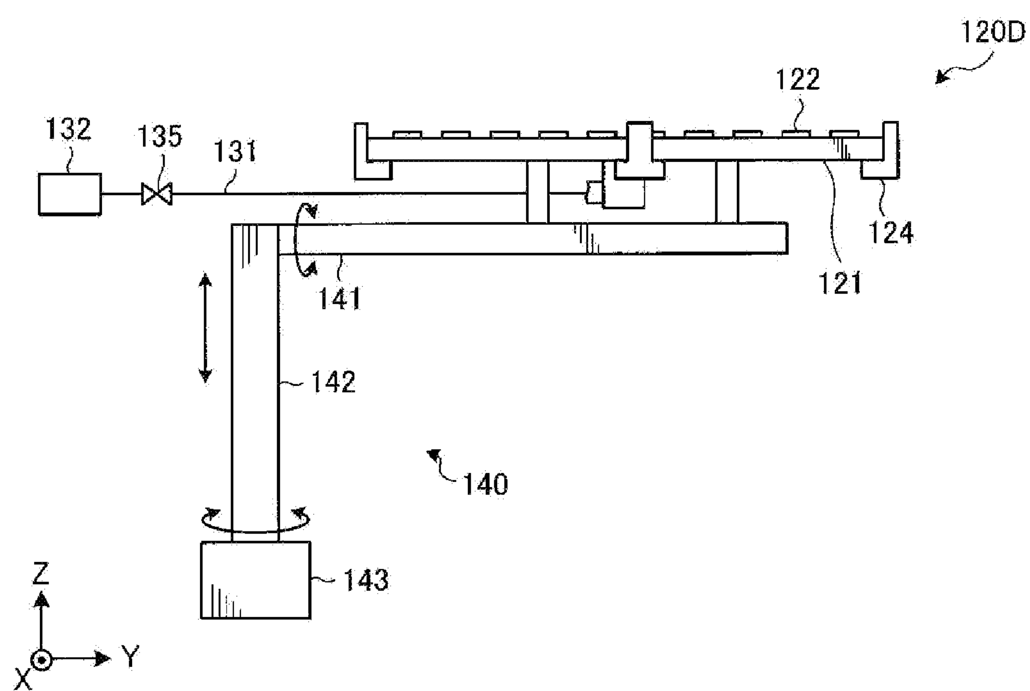
FIG. 13 is a schematic side view of a third conveyance apparatus according to a third exemplary embodiment.

FIG. 13 is a schematic side view of a third conveyance apparatus according to a third exemplary embodiment. In the following description, the same components as those already described have the same reference numerals, and overlapping descriptions will be omitted.

As illustrated in FIG. 13, a third conveyance apparatus 120D according to the third exemplary embodiment further includes a flow rate adjusting unit 135, besides the respective components provided in the third conveyance apparatus 120 according to the first exemplary embodiment. The flow rate adjusting unit 135 is provided in the middle of the gas supply tube 131, and controls the flow rate of the gas supplied from the gas supply device 132. The operation of the flow rate adjusting unit 135 is controlled by the conveyance control unit 51 of the control device 50. The conveyance control unit 51 adjusts the flow rate of the gas jetted from the respective nozzles 122 by controlling the flow rate adjusting unit 135.

Figure 14:
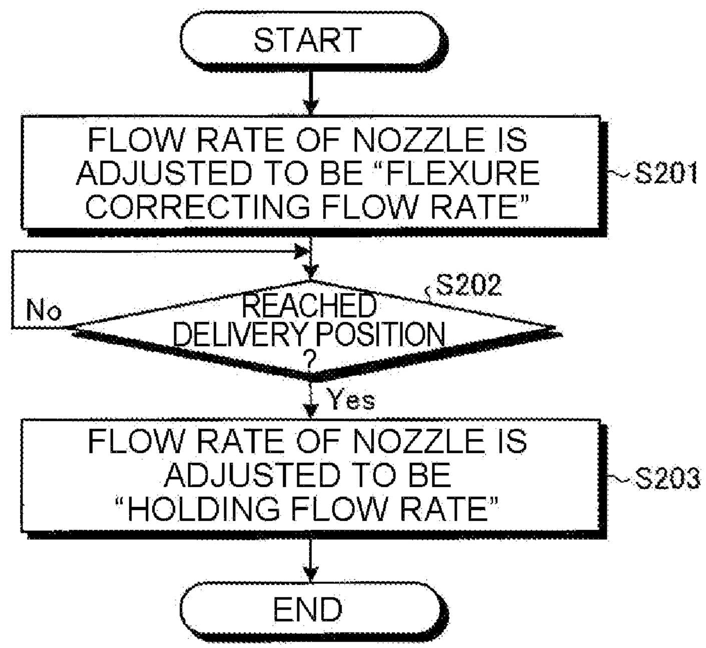
FIG. 14 is a flow chart illustrating a processing sequence of a flow rate control process according to the third exemplary embodiment.

Here, the sequence of the flow rate control process according to the third exemplary embodiment will be described with reference to FIG. 14. FIG. 14 is a flow chart illustrating a processing sequence of a flow rate control process according to the third exemplary embodiment. FIG. 14 also illustrates the processing sequence until the substrate to be processed W is held by the third conveyance apparatus 120D after jetting of a gas from the nozzles 122 is started.

As illustrated in FIG. 14, the conveyance control unit 51, first, controls the flow rate adjusting unit 135 to adjust the flow rate of the nozzles 122 to a "flexure correcting flow rate" (step S201). The "flexure correcting flow rate" is a flow rate for correcting the flexure of a substrate to be processed W and is smaller than a "holding flow rate" which is required for the nozzles 122 to hold the substrate to be processed W.

In this manner, before the third conveyance apparatus 120D reaches the delivery position, the gas is jetted from the nozzles 122 so that the flexure of the substrate to be processed W may be corrected by the gas jetted from the nozzles 122. Since the flow rate of the gas jetted from the nozzles 122 is set as the "flexure correcting flow rate" which is smaller than the "holding flow rate", the third conveyance apparatus 120D may be suppressed from holding the substrate to be processed W before reaching the delivery position.

Subsequently, the conveyance control unit 51 determines whether the nozzles 122 of the third conveyance apparatus 120D have reached the delivery position (step S202). When it is determined that the nozzles 122 have reached the delivery position (step S202, Yes), the conveyance control unit 51 adjusts the flow rate of the nozzles 122 to the "holding flow rate" (step S203). Accordingly, the substrate to be processed W is held by the third conveyance apparatus 120D in a non-contact manner.

When the processing in step S203 is finished, the conveyance control unit 51 finishes the flow rate control process. When in step S202, the third conveyance apparatus 120D has not reached the delivery position (step S202, No), the conveyance control unit 51 repeats the determination processing in step S202 until the third conveyance apparatus 120D reaches the delivery position.

In this manner, in the third exemplary embodiment, the conveyance control unit 51 causes a gas to be jetted from the nozzles 122 at the flexure correcting flow rate smaller than the holding flow rate which generates a negative pressure between the nozzles 122 and the substrate to be processed W until the nozzles 122 reach the position the substrate to be processed W is held. Accordingly, by the third conveyance apparatus 120D according to the third exemplary embodiment, it is possible to correct the flexure of the substrate to be processed W by using conventional members without newly adding a dedicated member such as, for example, the gas jetting parts 123.

Fourth Exemplary Embodiment

In the above-described third exemplary embodiment, for example, the flow rate control of the respective nozzles 122 is performed as a whole. However, the nozzles 122 may be divided into a plurality of regions, and the flow rate control may be individually performed for each of the regions.

Figure 15A:
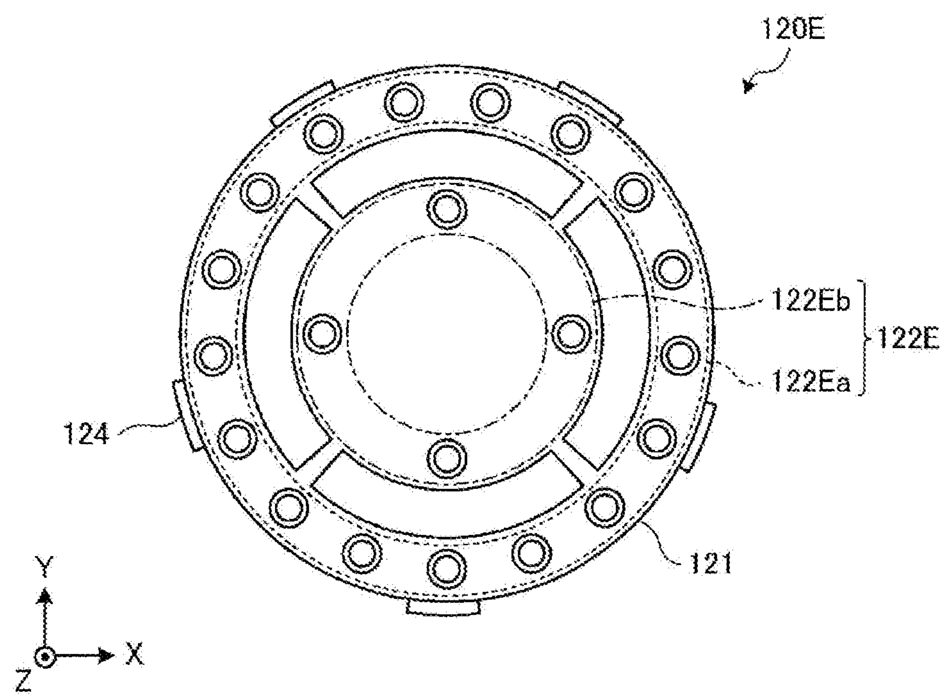
FIG. 15A is a schematic plan view of a third conveyance apparatus according to a fourth exemplary embodiment.
Figure 15B:
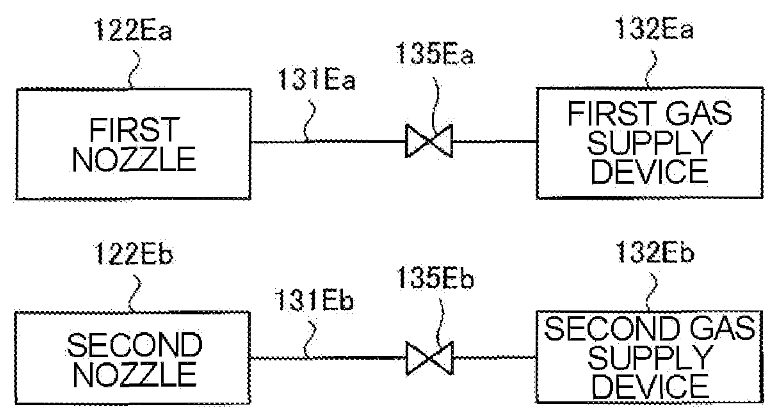
FIG. 15B is a schematic view illustrating the connection relationship between a nozzle and a gas supply device.

Hereinafter, an example of performing a flow rate control of respective nozzles individually for each of the respective regions of the nozzles will be described. FIG. 15A is a schematic plan view of a third conveyance apparatus according to a fourth exemplary embodiment. FIG. 15B is a schematic view illustrating the connection relationship between a nozzle and a gas supply device.

As illustrated in FIG. 15A, a third conveyance apparatus 120E is provided with nozzles 122E including first nozzles 122Ea and second nozzles 122Eb.

The first nozzles 122Ea among the nozzles 122E are arranged circumferentially along the peripheral portion of the main body unit 121, and the second nozzles 122Eb are arranged circumferentially at the more inner circumferential side than the first nozzles 122Ea. For example, the first nozzles 122Ea and the second nozzles 122Eb may have the same shapes as those of the first nozzle 122Aa illustrated in FIG. 6B and the second nozzle 122Ab illustrated in FIG. 6C, respectively.

As illustrated in FIG. 15B, a first nozzle 122Ea is connected to a first gas supply device 132Ea via a gas supply tube 131Ea, and a second nozzle 122Eb is connected to a second gas supply device 132Eb via a gas supply tube 131Eb. The gas supply tube 131Ea is provided with a flow rate adjusting unit 135Ea configured to adjust the flow rate of the gas supplied from the first gas supply device 132Ea, and the gas supply tube 131Eb is provided with a flow rate adjusting unit 135Eb configured to adjust the flow rate of the gas supplied from the second gas supply device 132Eb. The flow rate adjusting units 135Ea and 135Eb are controlled by the conveyance control unit 51.

Figure 16:
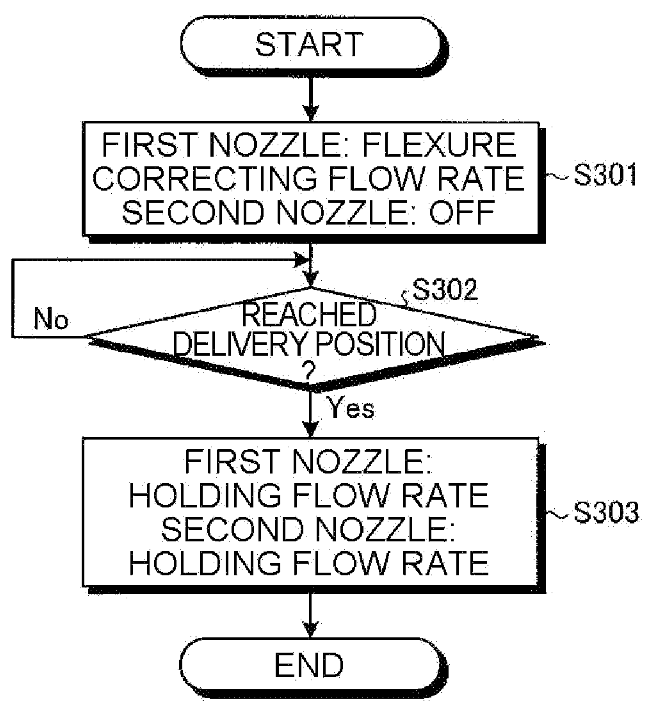
FIG. 16 is a flow chart illustrating a processing sequence of a flow rate control process according to the fourth exemplary embodiment.

Hereinafter, the sequence of the flow rate adjusting process according to the fourth exemplary embodiment will be described with reference to FIG. 16. FIG. 16 is a flow chart illustrating a processing sequence of a flow rate control process according to the fourth exemplary embodiment. FIG. 16 also illustrates the processing sequence until a substrate to be processed W is held by the third conveyance apparatus 120E after jetting of a gas from the nozzles 122E is started.

As illustrated in FIG. 16, the conveyance control unit 51, first, causes a gas to be jetted from the first nozzles 122Ea at a "flexure correcting flow rate" while turning off the second nozzles 122Eb (step S301). Accordingly, the flexure of the substrate to be processed W may be corrected by the gas jetted from the first nozzles 122Ea.

The second nozzles 122Eb disposed at the central portion of the main body unit 121 hardly directly contribute to the correction of the flexure of the substrate to be processed W. For this reason, while the first nozzles 122Ea jet the gas at the "flexure correcting flow rate", the flow rate of the second nozzles 122Eb may be set to be zero so as to inhibit unnecessary jetting of the gas.

Subsequently, the conveyance control unit 51 determines whether the third conveyance apparatus 120E has reached the delivery position (step S302). When it is determined that third conveyance apparatus 120E has reached the delivery position (step S302, Yes), the conveyance control unit 51 causes the gas to be jetted from the first nozzles 122Ea and the second nozzles 122Eb at a "holding flow rate" (step S303). Accordingly, the substrate to be processed W is held by the third conveyance apparatus 120E in a non-contact manner.

When the processing in step S303 is finished, the conveyance control unit 51 finishes the flow rate control process. When in step S302, the third conveyance apparatus 120E has not reached the delivery position (step S302, No), the conveyance control unit 51 repeats the determination processing in step S302 until the third conveyance apparatus 120E reaches the delivery position.

In this manner, in the fourth exemplary embodiment, the conveyance control unit 51 causes a gas to be jetted from only the first nozzles 122Ea at the "flexure correcting flow rate" until the third conveyance apparatus 120E reaches the delivery position. Accordingly, it is possible to inhibit the unnecessary jetting of the gas.

In the above-described second exemplary embodiment, the flexure of a substrate to be processed W is corrected by using the gas jetted from the gas jetting parts 123, and in the third exemplary embodiment and the fourth exemplary embodiment, the flexure of a substrate to be processed W is corrected by using the gas jetted from the nozzles 122 and 122E. However, the present disclosure is not limited thereto. The flexure of a substrate to be processed W may be corrected by using both the gas jetting parts 123 and the nozzles 122 and 122E.

In each of the above-described embodiments, the third conveyance apparatus 120, 120A, 120C, 120D, or 120E performs delivery of a substrate to be processed W between the third conveyance apparatus 120, 120A, 120C, 120D, or 120E and the first cleaning apparatus 33. However, the present disclosure is not limited thereto. The third conveyance apparatus 120, 120A, 120C, 120D, or 120E also performs the same holding operation in relation to the third cleaning apparatus 43, the fourth cleaning apparatus 44 or the delivery unit 45. Further, the present disclosure is not limited to the third conveyance apparatus 120, 120A, 120C, 120D, or 120E. The second conveyance apparatus 110 also performs the same holding operation as that of the third conveyance apparatus 120, 120A, 120C, 120D, or 120E, in relation to the peeling apparatus 31 or the first cleaning apparatus 33.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate conveyance apparatus comprising:

a plurality of nozzles configured to jet a gas toward a surface of a substrate to hold the substrate in a non-contact manner, at least some of the plurality of nozzles having a chamfered distal end surface; and a main body unit provided with the plurality of nozzles, wherein at least surfaces of the plurality of nozzles are formed of a resin, and the plurality of nozzles include first nozzles arranged circumferentially on the main body unit and second nozzles arranged circumferentially at a more inner circumferential side than the first nozzles on the main body unit, only the first nozzles having the chamfered distal end surface.

2. The substrate conveyance apparatus of claim 1, wherein the resin has a thermal expansion coefficient which is substantially the same as that of the main body unit.

3. The substrate conveyance apparatus of claim 2, wherein the main body unit is formed of aluminum, and the resin is a polybenzoimidazole (PBI) resin.

4. The substrate conveyance apparatus of claim 1, wherein the plurality of nozzles are fixed to the main body unit by screws.

5. The substrate conveyance apparatus of claim 4, wherein the plurality of nozzles have screw holes through which the screws are inserted, and distal end portions of the screw holes at which screw heads of the screws are disposed are formed more deeply as compared to the screw heads.

6. The substrate conveyance apparatus of claim 1, further comprising a gas jetting part provided at a more outer peripheral side of the main body unit than the plurality of nozzles, and configured to jet a gas toward an outer peripheral portion of the substrate.

7. The substrate conveyance apparatus of claim 6, wherein the gas jetting part jets the gas at a flow rate smaller than a flow rate of the gas jetted from the plurality of nozzles.

8. The substrate conveyance apparatus of claim 1, wherein the plurality of nozzles include first nozzles arranged circumferentially on the main body unit, and second nozzles arranged circumferentially at a more inner circumferential side than the first nozzles on the main body unit, each of the first nozzles is provided with one of a plurality of flow rate adjusting units, each of the second nozzles is provided with the other of the plurality of flow rate adjusting units, and the other of the plurality of flow rate adjusting units stop the gas jetted from each of the second nozzles before the substrate conveyance apparatus reaches a delivery position.

9. A substrate peeling system comprising:

a peeling apparatus configured to separate a superimposed substrate including a first substrate bonded to a second substrate into the first substrate and the second substrate; and a substrate conveyance apparatus configured to convey the first substrate separated by the peeling apparatus while holding the first substrate in a non-contact manner, wherein the substrate conveyance apparatus includes:

a plurality of nozzles configured to jet a gas toward a surface of the first substrate to hold the first substrate in a non-contact manner, at least some of the plurality of nozzles having a chamfered distal end surface; and a main body unit provided with the plurality of nozzles, at least surfaces of the plurality of nozzles are formed of a resin, and the plurality of nozzles include first nozzles arranged circumferentially on the main body unit and second nozzles arranged circumferentially at a more inner circumferential side than the first nozzles on the main body unit, only the first nozzles having the chamfered distal end surface.

10. The substrate peeling system of claim 9, wherein the plurality of nozzles include first nozzles arranged circumferentially on the main body unit, and second nozzles arranged circumferentially at a more inner circumferential side than the first nozzles on the main body unit, each of the first nozzles is provided with one of a plurality of flow rate adjusting units, each of the second nozzles is provided with the other of the plurality of flow rate adjusting units, and the other of the plurality of flow rate adjusting units stop the gas jetted from each of the second nozzles before the substrate conveyance apparatus reaches a delivery position.

* * * * *